Aug. 8, 1961 W. M. SHARPLESS 2,995,475
FABRICATION OF SEMICONDUCTOR DEVICES
Filed Nov. 4, 1958
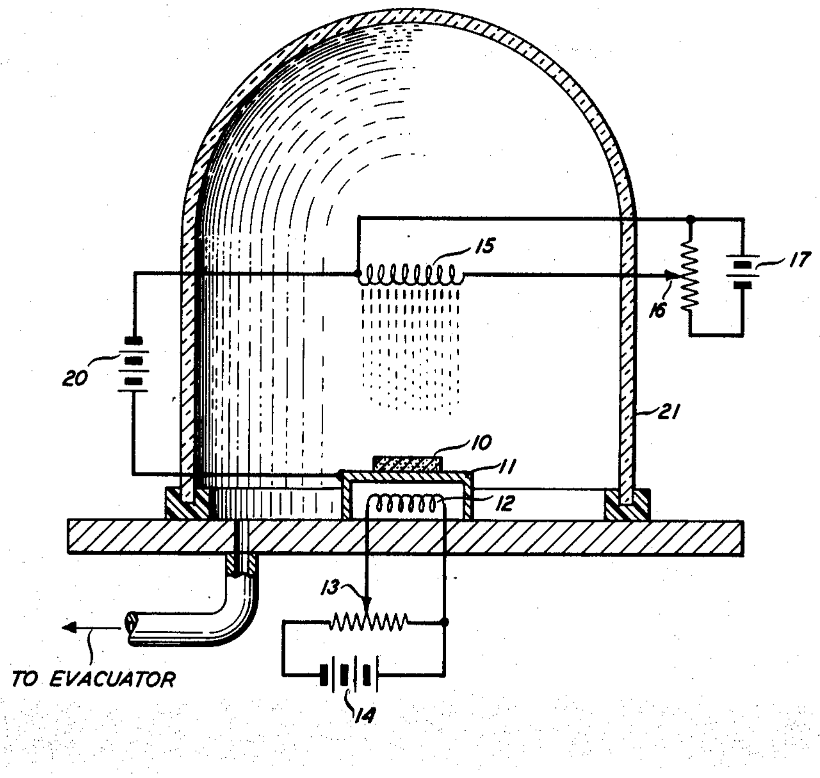
INVENTOR
W. M. SHARPLESS
BY Roy M. Porter, Jr.
ATTORNEY Aug. 8, 1961 W. M. SHARPLESS 2,995,475
FABRICATION OF SEMICONDUCTOR DEVICES
Filed Nov. 4, 1958
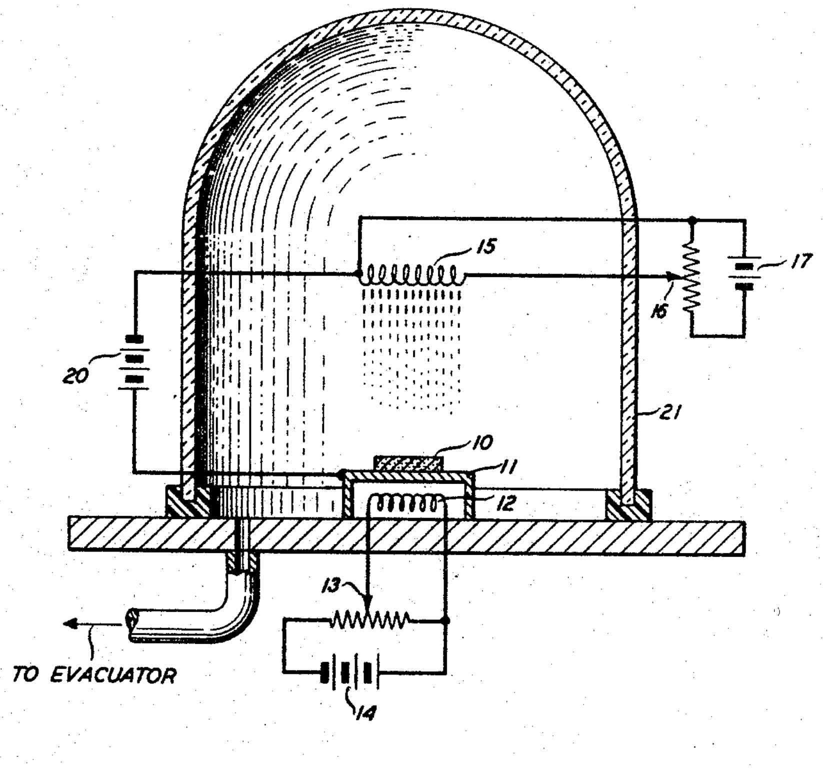
INVENTOR
W. M. SHARPLESS
BY Ray M. Porter, Jr.
ATTORNEY United States Patent Office 2,995,475

Patented Aug. 8, 1961

2,995,475

FABRICATION OF SEMICONDUCTOR DEVICES

William M. Sharpless, Fair Haven, N.J., assignor to Bell Telephone Laboratories, Incorporated, New York, N.Y., a corporation of New York Filed Nov. 4, 1958, Ser. No. 771,881
5 Claims. (Cl. 117—213)

This invention relates to a method for making electrical contact to crystalline semiconductive bodies and more particularly to a method for making large area low resistance ohmic contacts to gallium arsenide crystals.

A simplified flow diagram of the method is as follows:

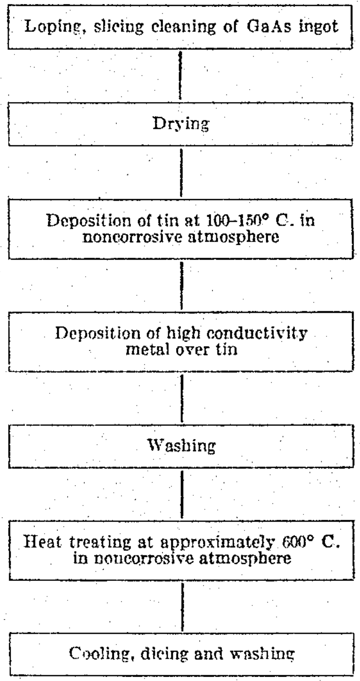

Silicon and germanium semiconductor materials have been used in point-contact rectifiers and transistors for many years and numerous types of semiconductor devices employing these two materials are commercially available today. Technical papers too numerous to mention have been published covering the important features of these group IV semiconductor materials.

More recently, however, there has been increased interest in some of the semiconductor materials generally referred to as the intermetallic compounds. These are formed by a combination of a group III and a group V element and tend to possess some of the better properties of both silicon and germanium. Due to the higher energy gap, higher electron mobilities and, in some cases, lower dielectric constants of some of these III–V compounds, they tend to make more efficient high frequency rectifiers and transistors and appear to be capable of operating at higher temperatures than either silicon or germanium.

Of the several III–V intermetallic compounds, gallium arsenide (GaAs) appears to be very promising for use in high frequency point contact rectifiers. It has been found, however, that the specific techniques developed and successfully used in processing other semiconductor materials, such as germanium and silicon, are inapplicable to gallium arsenide. In particular, it has been found that the prior art methods of making large area low resistance contact to silicon and germanium are generally inadequate when applied to crystals of gallium arsenide.

Before proceeding, it would be well to understand what is meant by an "ohmic contact." For the purposes of this invention, an ohmic contact is one which serves purely as a means for getting current into and out of the semiconductor but which plays no part in the active process occurring in the device itself. While in practice this ideal cannot be realized since the contact will have some small though finite resistance, it nevertheless is a contact substantially free from any rectification or other nonlinear effects.

The efficacy of a process for forming ohmic contacts on semiconductor bodies may be evaluated by considering a few of the more important electrical and mechanical properties of such contacts. Electrically, the contact should have an extremely low resistance. This is particularly important in the case of base contacts in transistors where an extra base resistance in, for example, grounded base circuits, adds to the regenerative feedback and decreases the range of stable operation of the device. In diode devices unnecessary resistance at the ohmic contact decreases the reverse-to-forward impedance ratio and introduces additional losses.

It is another requirement of a good ohmic contact that the generation of minority carriers in the semiconductor body be suppressed when current flows across the contact. To permit the generation of minority carriers would tend to decrease the collector efficiency of transistors and degrade their on-off characteristics in switching applications.

Mechanically the ohmic contact may be called upon to provide mechanical support for the semiconductor element. Hence, the bond to the semiconductor crystal must be strong. It must also provide a surface to which external connections may be soldered or welded, and finally the bond must be electrically and mechanically stable so as not to be a limiting factor in the life of the device.

It is therefore the primary object of this invention to make large area, low resistance contacts to gallium arsenide crystals which introduce no rectifying or other nonlinear effects.

It is a further object that such contacts be mechanically strong.

It is another object of this invention that such contacts be highly uniform and stable in their electrical and mechanical characteristics.

The various objects of this invention are realized by placing upon the contact area of the gallium arsenide crystal a bimetallic deposit comprising a first layer of contact material followed by a second or outer layer of protective material. The bimetallic coated crystal is then heat treated, alloying the contact material to the crystal to form a mechanically strong and electrically efficient ohmic contact. The protective material provides the necessary surface area for the making of external connections to the crystal device.

Generally, the contact material is of a class which does not tend to alter the type of current carriers present in the semiconductor crystal and as such varies, depending upon the nature of the original doping used. Thus, for example, in N-type gallium arsenide, one might normally use the group VI elements for a back contact deposit. However, while these materials, acting as donors, would not change the type of current carriers present, they would tend to increase their number, thus changing the resistivity of the semiconductor material. As will be explained hereinafter, the resistivity of the material has an important bearing on the eletcrical characteristics of the semiconductor devices made therefrom. For this reason, therefore, it is an added requirement that the contact material neither alter nor substantially increase the current carriers present or, stated another way, the contact materials should be substantially neutral with respect to the gallium arsenide. It has been discovered that tin, one of the group IV elements, satisfies these requirements and furthermore has a sufficiently low melting point which facilities alloying the tin material to the gallium arsenide to produce an ohmic contact having the desired electrical and mechanical properties discussed above.

The outer layer, on the other hand, is chosen from among those metals which have a high melting point and high electrical conductivity and include among them nickel, copper, silver and gold as illustrative of the metals which may be used.

In one specific and preferred embodiment of this invention, a bimetallic layer of tin and nickel is deposited upon the gallium arsenide crystal and subjected to suitable heat treatment. Thus, in accordance with the invention, a layer of tin is deposited upon a flat, clean surface of the gallium arsenide crystal in a vacuum at a target temperature of approximately 100° C. This is followed by the deposition of a layer of nickel. The GaAs crystal slice and its tin-nickel deposits are then heat treated in a vacuum at a temperature at which the tin will start to penetrate or diffuse into the gallium arsenide, forming the requisite electrical-mechanical bonding to the gallium arsenide crystal while leaving a tough nickel outer surface upon which the necessary external connections may be made by soldering or otherwise. Back contacts made in accordance with the invention are very uniformly adherent and, when the sample is diced into miniature sections, are suitable for soldering to small supporting structures of the type found in many high frequency devices.

The invention, as above noted, and other features thereof will be understood more clearly and fully from the following detailed description with reference to the accompanying drawing, in which:

The figure shows a method for depositing a thin, uniform layer of tin on the gallium arsenide crystal.

The single crystal ingots of GaAs are prepared by appropriately doping "pure" GaAs with controlled amounts of elements from group VI in the periodic table, such as tellurium, sulphur, or selenium. This results in the production of N-type material. As is known, the degree of doping employed determines the resistivity of the resulting GaAs material. At present, materials having resistivities between .002 and .09 ohm centimeter have been made and used in different types of gallium arsenide rectifiers. It has been found, for example, that the lower resistivity materials (.002 ohm centimeter) have the lowest spreading resistance, and hence introduce lower losses and consequently tend to be best suited for use in very high frequency first detectors. They do not, however, possess the characteristics which will allow a high back impedance to be present at drive voltages above a few volts, but this is not important in a low level first detector. Higher resistivity materials (.02 to .09 ohm centimeter) produce rectifiers having a satisfactorily low forward resistance and at the same time possess high reverse impedances over a range of reverse voltages of from 10 to 30 volts. Such material produces rectifiers suitable for use in switching circuits or as a nonlinear variable capacity device. Thus, the control of doping, and hence the resistivity, is an important factor to be considered in selecting the particular gallium arsenide to be used in any particular application.

Using a 0.0085 inch thick diamond saw, the doped ingot is sliced in a direction normal to its longtitudinal axis. A typical slice has a thickness of about 0.03 inch and a diameter of about ¼ inch. The surfaces of the slice are rough lapped until a smooth flat surface is obtained on each face. This may be done with any abrasive commonly used for such purposes. The surfaces are then washed in an etchant for about one minute, or just long enough to lightly etch the crystal and remove all loose dirt and grit. Suitable etchants include one part concentrated $HNO_3$, one part 48% HF and four parts distilled water. The crystal is then washed to remove excess etchant. A suitable procedure includes washing in distilled water, followed by washing in absolute alcohol.

The initial deposition of material to be used for the back contact may be carried out in any number of ways known in the art such as by sputtering, evaporation, or electroplating. Particularly uniform results are obtained by means of an evaporation process in which tin is evaporated in a vacuum from a hot tin covered tungsten filament. An arrangement for performing this step is shown in the figure. The gallium arsenide crystal 10 is placed upon a heating plate 11 in enclosure 21. The enclosure 21 is then evacuated, by means not shown, until a vacuum equivalent to $2–4\times10^{-6}$ millimeters of mercury is established within the enclosure. The evacuating means is continuously available to remove any gases which may be emitted from the gallium arsenide during the plating process. The heating plate 11 is preheated to between 100 to 150° C. and maintained at a temperature in this range by means of a filament 12 which connects to a source of current 14 through potentiometer 13. Located above the gallium arsenide crystal 10 is a second filament 15 which comprises a tin-coated tungsten member which connects to a source of electrical potential 17 through potentiometer 16. A positive accelerating voltage from a source 20 of about 450 volts with respect to the tin-plated tungsten filament is applied to the plate 11 holding the gallium arsenide sample.

After the sample 10 is placed upon the heating plate 11 and all electrical connections have been made, the enclosure 21 is evacuated. During this period the sample is heated to the temperature of the heating plate. This heating tends to further dry the sample and de-gas the surface in preparation for plating. The temperature of the tin-plated filament 15 is then slowly raised by means of potentiometer 16. As the tin is evaporated from the filament it is accelerated by means of potential 20 and tin is deposited onto the gallium arsenide sample. The process is continued until a layer of approximately 4000 angstroms thick is deposited.

While the exact thickness of the tin is not critical and may vary appreciably, there should be sufficient tin deposited to accommodate the subsequent alloying and still leave a sufficiently thick layer to which the protective coating can adhere. While a thicker layer is not objectionable, a layer approximately 4,000 angstroms thick has been found to give uniformly good results.

Because of the relatively low melting point of tin and the thin deposit used, an outer or protective layer of a second material is needed. A desirable type of protective material is one having a relatively high melting point and a high electrical conductivity. Typical of such materials are the metals such as nickel, copper, gold, and silver. As before, the plating procedure used may involve any of the standard techniques. In a specific embodiment of this invention, an electro-less deposit of nickel is put down over the tin. In this process, the tin plated gallium arsenide crystal is removed from the vacuum enclosure used for the evaporation of the tin and placed in a nickel solution. While the conditions and various solutions suitable for the electro-less plating of nickel are well known in the art, one suitable solution that has been used comprises the following:

| | G./l. |
|---|---|
| Nickel sulfate | 35 |
| Sodium citrate | 10 |
| Sodium acetate | 10 |
| Sodium orthophosphate di-H | 15 |
| Magnesium sulfate | 20 |

The pH factor for the above solution should be between 5.6 and 5.8, and the temperature of the bath between 88 and 94° C. Under these conditions, the plating process takes about six minutes in which time a layer of between ½ mil to 1 mil of nickel is deposited, depending upon the temperature of the solution. It has been found that a plating period of from between three to twelve minutes is generally of sufficient duration to deposit an adequate layer of nickel.

As a convenience in identifying the tinned surface, the side that is not tinned may be marked with a pencil prior to placing it in the nickel solution. This marking will be readily visible through the nickel deposit.

Upon removal from the nickel solution, the crystal is washed in distilled water to remove all excess plating solution, and then washed in absolute alcohol and placed in a second vacuum furnace for heat treating to improve the adherence of the tin to the gallium arsenide.

As indicated above, it is the purpose of the process herein outlined, to make a strong, stable ohmic contact to the gallium arsenide crystal to which external connections may be made. It has been found that the tin and nickel deposited, as above described, satisfactorily adhere to each other, with the nickel providing the requisite external surface for soldering purposes. It now remains to firmly combine the tin-nickel deposits to the gallium arsenide crystal. This is accomplished by alloying the tin to the gallium arsenide.

Prior to placing the crystal in the alloying furnace, the latter is preheated to btween 590 and 610° C. The gallium arsenide is placed in a separate container to which is added a non-corrosive atmosphere with respect to the gallium arsenide, the tin, and the nickel. In a preferred embodiment of the invention, the atmosphere is a vacuum, the container being evacuated to produce a vacuum equivalent to $2–4 \times 10^{-6}$ millimeters of mercury. The evacuated container is then inserted into the furnace. When this is done the furnace temperature will tend to drop initially. The furnace is allowed to recover to approximately 600° C. again, after which the crystal in its evacuated chamber is retained in the furnace for about five minutes. Following this period, the evacuated chamber is removed and allowed to cool directly to room temperature. The vacuum is then released and the annealing is complete.

During the heating period the tin starts to penetrate or diffuse into the gallium arsenide crystal. As a large penetration is not desired, the temperature of the furnace and the time interval during which the crystal is in the furnace must be reasonably carefully watched to avoid excessive penetration on one hand, or too little penetration on the other hand. In addition, if the temperature goes much above 610° C., there is danger that the arsenic will tend to separate out of the crystal, thus destroying the stoichiometric balance and resistivity of the crystal. Below 590°, on the other hand, the tin does not penetrate adequately to form the type of bond sought.

After alloying, the part may be probe tested for the quality of the ohmic contact. First the nickel layer is removed from the non-tinned surface, which surface can be identified by the pencil marking. This may be done by rough lapping with an abrasive. The crystal is then washed in absolute alcohol and the newly exposed gallium arsenide lightly etched three times for one second intervals with a suitable etchant, as, for example, with CP8 solution comprising equal parts by volume of concentrated nitric acid and 48% hydrofluoric acid. Alternately, the crystals may be etched in less concentrated solutions for longer periods, if desired. The crystal is washed in distilled water and absolute alcohol between each etching step. Probe testing is then done with a 3-mil sharpened Phosphor bronze point.

After testing the crystal is diced into smaller units for use as required as nonlinear capacitive or resistive type rectifier units or as transistors.

Of the several hundred dicings treated in accordance with the above outlined procedure, yields of greater than ninety percent have been obtained after dicing. The ten percent rejects are for all defects, and include defective back contacts as but one of the reasons. This rate of yield is deemed particularly good.

In all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. The method of fabricating a low resistance contact to a body of N-type gallium arsenide material which comprises heating said body to a temperature between 100 to 150° C., depositing a layer of tin on said heated body, depositing a layer of high conductivity metallic material on said tin deposit and alloying said tin to said body at a temperature betwten 590 and 610° C.

2. The method according to claim 1 wherein the steps of heating said body and alloying said tin are carried out in a non-corrosive atmosphere with respect to said gallium arsenide, said tin and said high conductivity metal.

3. The method according to claim 2 wherein said atmosphere is a vacuum.

4. The method according to claim 1 wherein said high conductivity metal is nickel.

5. The method according to claim 4 wherein said nickel is deposited by an electro-less process.

References Cited in the file of this patent

UNITED STATES PATENTS

| | | |
|---|---|---|
| 2,139,431 | Votter | Dec. 6, 1938 |
| 2,671,746 | Brew | Mar. 9, 1954 |
| 2,798,013 | Irmler | July 2, 1957 |
| 2,847,623 | Thornhill | Aug. 12, 1958 |
| 2,930,106 | Wrotnowski | Mar. 29, 1960 |